United States Patent [19]
Kato et al.

[11] Patent Number: 5,907,426
[45] Date of Patent: May 25, 1999

[54] STABILIZING DEVICE FOR OPTICAL MODULATOR

[75] Inventors: Naohiko Kato; Hiroshi Ito; Tadashi Ichikawa; Tomoyoshi Motohiro; Tatsumi Hioki, all of Aichi-ken, Japan

[73] Assignee: Kabushiki Kaisha Toyota Chuo Kenkyusho, Aichi-ken, Japan

[21] Appl. No.: 08/884,661

[22] Filed: Jun. 27, 1997

[30] Foreign Application Priority Data

Jun. 28, 1996 [JP] Japan ................................. 8-170185

[51] Int. Cl.⁶ .......................... H04B 10/145; G02F 1/035; G02F 1/055
[52] U.S. Cl. .......................... 359/239; 359/183; 359/187; 385/3
[58] Field of Search .................... 359/181–184, 359/239, 187; 385/2, 3

[56] References Cited

U.S. PATENT DOCUMENTS

| | | | |
|---|---|---|---|
| 5,210,407 | 5/1993 | Ito et al. | 250/227.11 |
| 5,227,715 | 7/1993 | Ito et al. | 324/96 |
| 5,278,499 | 1/1994 | Ito et al. | 324/244.1 |
| 5,359,449 | 10/1994 | Nishimoto et al. | 359/181 |
| 5,383,046 | 1/1995 | Tomofuji et al. | 359/176 |
| 5,696,859 | 12/1997 | Onaka et al. | 385/24 |

FOREIGN PATENT DOCUMENTS

3-145623  6/1991  Japan .
5-232412  9/1993  Japan .

*Primary Examiner*—Georgia Epps
*Assistant Examiner*—Margaret Burke
*Attorney, Agent, or Firm*—Oblon, Spivak, McClelland, Maier & Neustadt, P.C.

[57] ABSTRACT

A device for stabilizing a modulation operation of an optical modulator is provided, the optical modulator having an optical waveguide provided on a substrate and an electrode provided so as to correspond to the optical waveguide, modulating light inputted to the optical waveguide by a voltage corresponding to a physical amount to be measured which is inputted to the electrode, and outputting the modulated light. The device includes: an optical detecting device for outputting signal corresponding to intensity of light outputted from the optical modulator; a control signal outputting device for, on the basis of the output signal of the optical detecting device, outputting a control signal which compensates a phase bias fluctuation of the optical modulator; a light source device for outputting control light corresponding to the control signal; and a voltage applying device, provided in contact with the electrode of the optical modulator, for applying voltage corresponding to the control light to the electrode. Accordingly, the light source device illuminates to the voltage applying device a control light corresponding to a driving signal which negatively feeds back a phase bias fluctuation signal. In this way, the voltage applying device applies a voltage which is set so as to offset variation in phase bias fluctuation in accordance with bias fluctuation, and the phase bias fluctuation is offset.

9 Claims, 7 Drawing Sheets

STABILIZING DEVICE FOR OPTICAL MODULATOR

BACKGROUND OF THE INVENTION

1. Field of the Invention

The present invention relates to a stabilizing device for an optical modulator, and in particular, to a stabilizing device for an optical modulator which stabilizes an optical modulator which modulates inputted light by an optical waveguide and outputs the modulated light.

2. Description of the Related Art

A waveguide-type optical modulator, which modulates light propagated within a waveguide formed on a substrate, is known. Stabilizing the operating point of the waveguide-type optical modulator is an important technique. For example, when a Mach-Zehnder interferometer optical modulator is used, by setting and stabilizing the phase bias, which is the operating point, to $\pi/2$, optimal sensitivity and an optimal dynamic range characteristic can be achieved.

However, when the Mach-Zehnder interferometer optical modulator is used, the phase bias is set by the difference in the waveguide length when the modulating element is set. The actual value of the phase bias is several 100 nm, and manufacturing is not easy. Further, a problem arises in that slight changes in the ambient temperature or the stresses applied to the substrate or the like lead to the operating point (the phase bias) drifting. Namely, it is difficult to stabilize the operating point.

Figure 1:
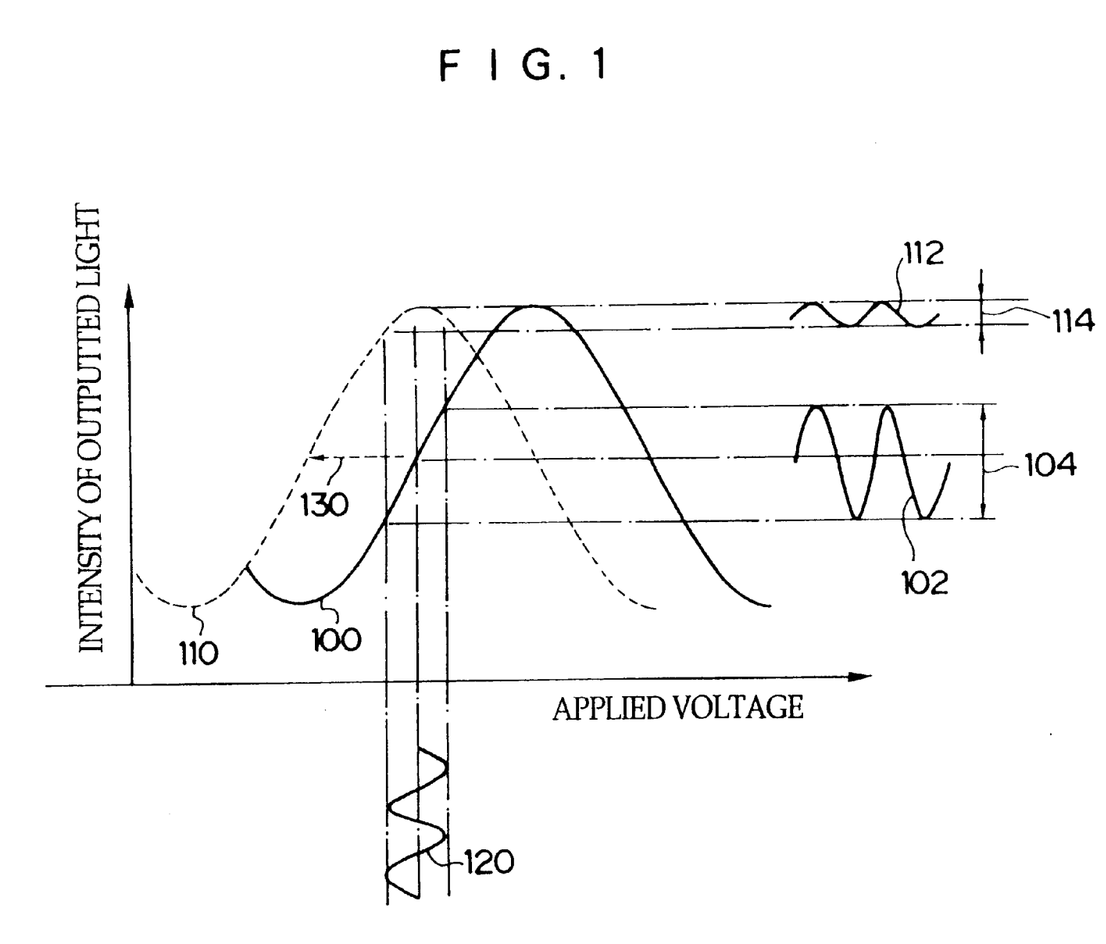
FIG. 1 is a graph illustrating characteristics of an optical modulator when the optical modulator is normal and when an operating point drifts.

FIG. 1 illustrates the characteristic of an optical modulator at a time when the optical modulator is normal and at a time when the operating point drifts. In FIG. 1, the horizontal axis is the voltage applied to the electrode of the optical modulator, and the vertical axis is the intensity of the outputted light of the optical modulator. When the Mach-Zehnder interferometer optical modulator is used, the intensity of the outputted light varies as a cosine function of the applied voltage. At the normal characteristic (characteristic curve 100), the phase bias is set to $\pi/2$ and the operating point is the point of the characteristic curve 100 at which the slope is the greatest. Accordingly, the variation in the intensity of the outputted light with respect to the applied voltage due to an input signal 120 (i.e., a variation amount 104 in an output characteristic 102) is greatest, and the sensitivity is the highest.

However, if the operating point drifts from the normal characteristic (fluctuates by a phase bias fluctuation amount 130) to have the characteristic of characteristic curve 110, the variation in the intensity of the outputted light with respect to the applied voltage due to the same input signal 120 (i.e., a variation amount 114 in an output characteristic 112) is extremely small. As a result, some type of means is needed in order to compensate for the drift in the operating point.

In order to compensate for the drift in the operating point, drift compensating techniques have been proposed in which voltage corresponding to the fluctuation amount of the operating point is applied from the exterior (see Japanese Patent Applications Laid-Open (JP-A) Nos. 3-145623, 5-232412). In these drift compensating techniques, when light is modulated by using an optical modulator in optical communication, voltage corresponding to the fluctuation amount of the operating point is applied from the exterior so as to compensate for the drift.

Figure 2:
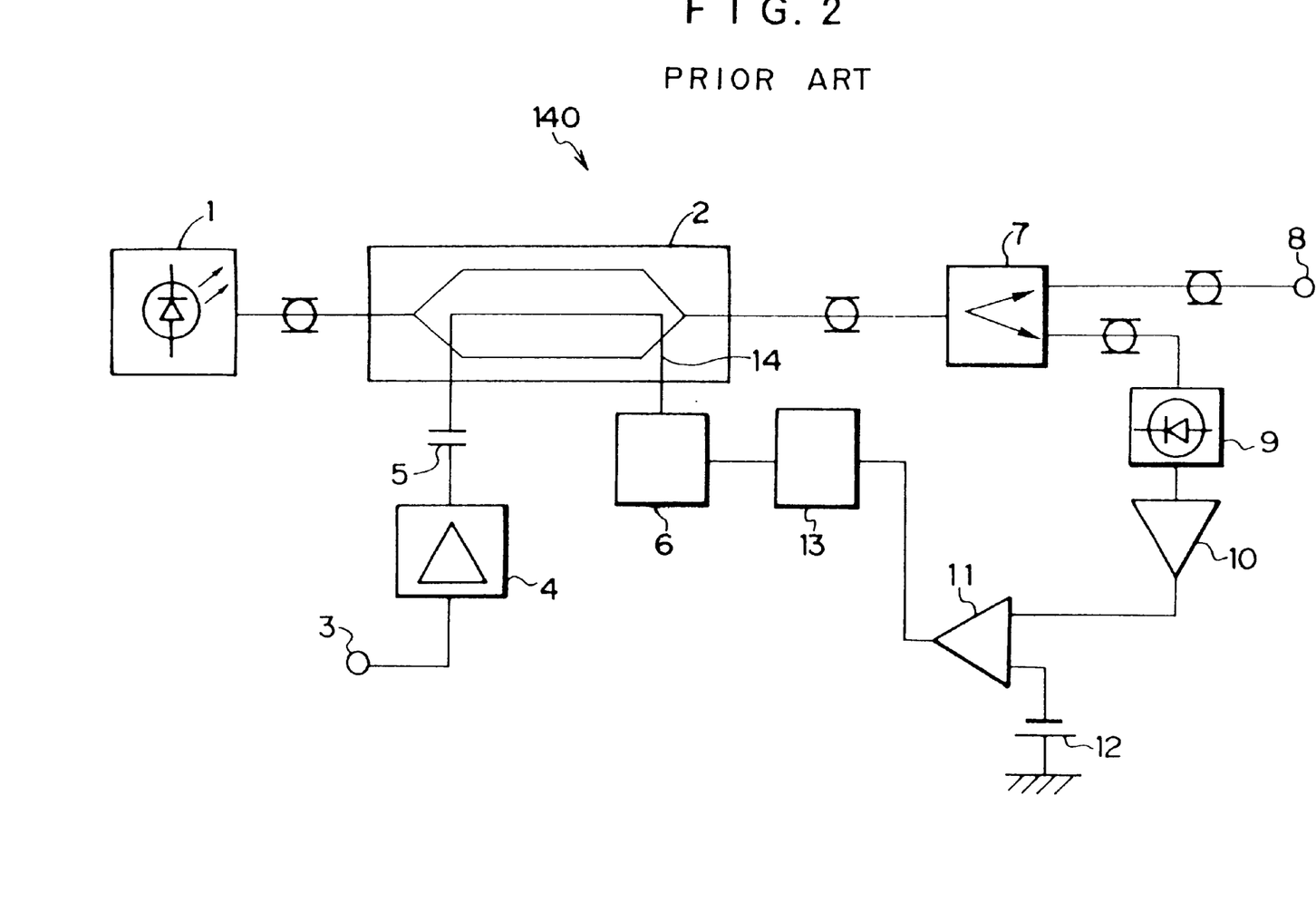

FIG. 2 illustrates an optical modulator 140 in which drift in the operating point is compensated for. In the optical modulator 140, 1 is a laser diode, 2 is an LiNbO$_3$ Mach-Zehnder interferometer optical modulator equipped with an electrode (hereinafter, "optical modulator"), 3 is a data signal input terminal, 4 is a modulator driving circuit, 5 is a coupling capacitor, 6 is a bias supplying circuit, 7 is a light branching device, 8 is an optical signal output terminal, 9 is a photodiode, 10 is a current voltage converter, 11 is an amplifier, 12 is a reference voltage source, 13 is a filter, and 14 is a metal wire which contacts the electrode.

A data signal inputted to input terminal 3 of the optical modulator 140 is inputted to the optical modulator 2 via the driving circuit 4 and the capacitor 5. At the optical modulator 2, the optical signal inputted from the laser diode 1 is intensity-modulated by an electrical signal inputted from the driving circuit 4. The data signal of the modified light is outputted from the output terminal 8.

The operating point of the optical modulator 2 at this time is controlled by the bias voltage supplied from the bias supplying circuit 6. More specifically, at the optical modulator 140, in order for voltage corresponding to the fluctuation amount of the operating point to be applied from the exterior, the metal wire 14 is connected to the electrode of the optical modulator 2. The operating point of the optical modulator 2 is controlled by an electric signal being applied to the wire 14. The control of the operating point is carried out by the light output waveform being monitored at the light branching device 7, the average value of the light output waveform being detected by the photodiode 9 and the current voltage converter 10, and the error voltage between the detected average value and reference value derived from the reference voltage source 12 being feedback as the bias voltage via the amplifier 11 and the filter 13. Namely, the deviation in the operating point is detected by monitoring the outputted light of the optical modulator 2, and the amount of deviation is feedback to voltage applied to the electrode of the optical modulator 2.

However, in a case in which a metal wire is connected to the optical modulator and an electrical signal is applied (as in the above-described case of the optical modulator 140), in the same way as an electric field probe, a waveguide-type modulator cannot be used in a light measuring device used in a sensor. Namely, the metal signal cable connected to the sensor disturbs the electromagnetic field to be measured, or an interference voltage is induced in the metal signal wire such that the signal/noise ratio decreases. Various problems, such as accurate measurement becoming difficult and the sensor becoming large, arise. As a result, the conditions of the environment in which the conventional optical modulator is used must be restricted by suppressing fluctuations in the ambient temperature by limiting the range of temperature in which the optical modulator is used, and by structuring the optical modulator such that loads such as stresses are not applied thereto, and the like.

SUMMARY OF THE INVENTION

In view of the aforementioned, an object of the present invention is to provide a stabilizing device for an optical modulator in which the operating point of a waveguide-type optical modulator can be stabilized so as to obtain an optimal sensitivity and an optimal dynamic range characteristic, without there being restrictions on the conditions of the environment in which the optical modulator is used.

In order to achieve the above-described object, a device for stabilizing a modulation operation of an optical modulator, the optical modulator having an optical waveguide provided on a substrate and an electrode provided so as to correspond to the optical waveguide, modulating light inputted to the optical waveguide by a voltage corresponding to a physical amount to be measured which is inputted to the electrode, and outputting the modulated light, the device of the first aspect of the present invention comprises: optical detecting means for outputting signal corresponding to intensity of light outputted from the optical modulator; control signal outputting means for, on the basis of the output signal of the optical detecting means, outputting a control signal which compensates a phase bias fluctuation of the optical modulator; light source means for outputting control light corresponding to the control signal; and voltage applying means, provided in contact with the electrode of the optical modulator, for applying voltage corresponding to the control light to the electrode.

In the first aspect of the invention, at the optical modulator, inputted light is modulated by voltage corresponding to a physical amount to be measured which is inputted to the electrode, and the modulated light is outputted. The intensity of the outputted light is detected at the optical detecting means, and a phase bias fluctuation amount of the optical modulator can be determined from the detected value. When the phase bias of the optical modulator fluctuates, the phase bias fluctuation is included in the outputted light of the optical modulator as a fluctuation in intensity. On the basis of the output signal of the optical detecting means, the control signal outputting means outputs a driving signal which offsets the bias fluctuation signal corresponding to the phase bias fluctuation of the optical modulator. The phase bias fluctuation is detected as a fluctuation in the intensity of the light. The magnitude of the fluctuation in the bias is detected, and a driving signal which generates an opposite bias fluctuation which substantially corresponds to the magnitude is outputted. In accordance with this driving signal, the light source means illuminates control light to the voltage applying means. Accordingly, due to the voltage corresponding to the driving signal, the control light changes in accordance with the bias fluctuation. The voltage applying means applies voltage corresponding to the control light to the electrode. In this way, due to the control light being illuminated to the voltage applying means, the voltage applying means applies voltage which corresponds to the bias fluctuation. The voltage applied to the electrode of the optical modulator is voltage which adjusts the phase bias of the optical modulator. This adjusting voltage is set so as to offset the change in the phase bias fluctuation. Therefore, even if a phase bias fluctuation occurs, due to the illumination of the control light and the application of voltage resulting from the illumination of the control light, the phase bias fluctuation is offset, and the characteristics of the optical modulator are stabilized.

The physical amount to be measured may be an electric field, a magnetic field, voltage, or current. For example, in a case in which the optical modulator is used as an electric field sensor, the electric field is used as the physical amount to be measured, and the inputted light is modulated by voltage corresponding to this electric field. Similarly, in a case in which the optical modulator is used as a magnetic sensor, magnetism is used as the physical amount to be measured, and the inputted light is modulated by voltage corresponding to this magnetism. Further, voltage and current outputted from other sensors can be used as the physical amounts to be measured. In this case, the inputted light is modulated by voltage resulting from the voltage and current corresponding to the detected amounts detected by the other sensors.

The light source means can be structured so as to include a light source portion which emits the control light, and an illuminating portion which illuminates onto the voltage applying means the control light emitted from the light source portion. The illuminating portion can be formed by a reflecting means such as a mirror, a guide means such as a fiber, or a combination thereof. By forming the light source means from the light source portion and the illuminating portion in this way, a structure for suppressing bias fluctuations can be set apart without being connected to the voltage applying means by electrical wires or the like.

In order to output a driving signal which offsets the bias fluctuation signal corresponding to the phase bias fluctuation of the optical modulating means, the signal outputting means is structured so as to extract the bias fluctuation signal corresponding to the phase bias fluctuation of the optical modulating means, negatively feedback the bias fluctuation signal, and output the driving signal. In accordance with this structure, the signal outputting means outputs a driving signal which negatively feeds back the bias fluctuation signal corresponding to the phase bias fluctuation. More specifically, the phase bias fluctuation is compared with, for example, a reference value, and a difference is determined. The magnitude of the bias fluctuation can thereby be detected, i.e., the bias fluctuation signal can be extracted. The light source means illuminates to the voltage applying means the control light corresponding to the driving signal which negatively feeds back the bias fluctuation signal. In this way, the voltage applying means applies a voltage which is set so as to offset the variation in the phase bias fluctuation in accordance with the bias fluctuation. The phase bias fluctuation is offset, and the characteristics of the optical modulator are stabilized.

In a second aspect of the present invention, in the device of the first aspect, the control signal outputting means includes an oscillator for outputting a predetermined constant frequency signal which is used to modulate the optical modulator, and extracting means for, on the basis of the output signal of the oscillator, extracting a signal component of the predetermined constant frequency from the output signal of the optical detecting means and outputting a signal corresponding to intensity of the extracted signal, the control signal outputting means superimposing the signal, which corresponds to the output signal of the extracting means and compensates a phase bias fluctuation of the optical modulator, upon the predetermined constant frequency signal to output the superimposed signal as the control signal.

In accordance with the second aspect of the invention, a low-frequency signal is superposed by a low-frequency oscillator on a direct current signal which is obtained by negative feedback of the bias fluctuation signal. In this way, the phase bias of the optical modulator oscillates slowly. This oscillation is removed by the extracting means, and only the bias fluctuation signal is extracted. The control light corresponding to the phase bias which has fluctuated is illuminated, and the photovoltaic voltage generated by this illumination and the adjusting voltage are generated. In this way, the phase bias fluctuation is offset, and the characteristics of the optical modulator are stabilized.

In a third aspect of the present invention, in the stabilizing device of the first aspect, said voltage applying means is formed by a photoelectric converting means formed by an anomalous photovoltaic film which contacts and is integrated with the electrode.

In the third aspect of the invention, the control light is illuminated to the anomalous photovoltaic film, and photovoltage corresponding to the control light is generated at the anomalous photovoltaic film. The phase bias fluctuation is offset, and the characteristics of the optical modulator are stabilized. Namely, due to the control light being illuminated to the anomalous photovoltaic film which is the photoelectric converting means, the anomalous photovoltaic film generates photovoltaic voltage corresponding to the bias fluctuation. The generated photovoltaic voltage is applied to the electrode of the optical modulator, and becomes voltage for adjusting the phase bias of the optical modulator. By providing a negative feedback structure such that the polarity of this adjusting voltage and the polarity of the variation in the phase bias fluctuation are opposite one another, even if a phase bias fluctuation is generated, due to the illumination of the control light, the generation of the photovoltaic voltage generated by the illumination, and the adjusting voltage, the phase bias fluctuation is offset and the characteristics of the optical modulator are stabilized. Because the anomalous photovoltaic film has ultra-high impedance, the frequency characteristics of an electric field sensor do not deteriorate.

The anomalous photovoltaic film is formed as a composite of an electrically-conductive substance and a semiconductor having a photovoltaic effect, and can easily be formed by two-source oblique simultaneous deposition by two deposit sources of CdTe and CdS.

BRIEF DESCRIPTION OF THE DRAWINGS

FIG. 2 is a schematic structural view illustrating a conventional optical modulator in which drift in the operating point is compensated for.

DESCRIPTION OF THE PREFERRED EMBODIMENT

Hereinafter, an example of an embodiment of the present invention will be described in detail with reference to the drawings. The present embodiment is an example in which the present invention is applied to the stabilization of an optical modulator used for electric field detection.

Figure 3:
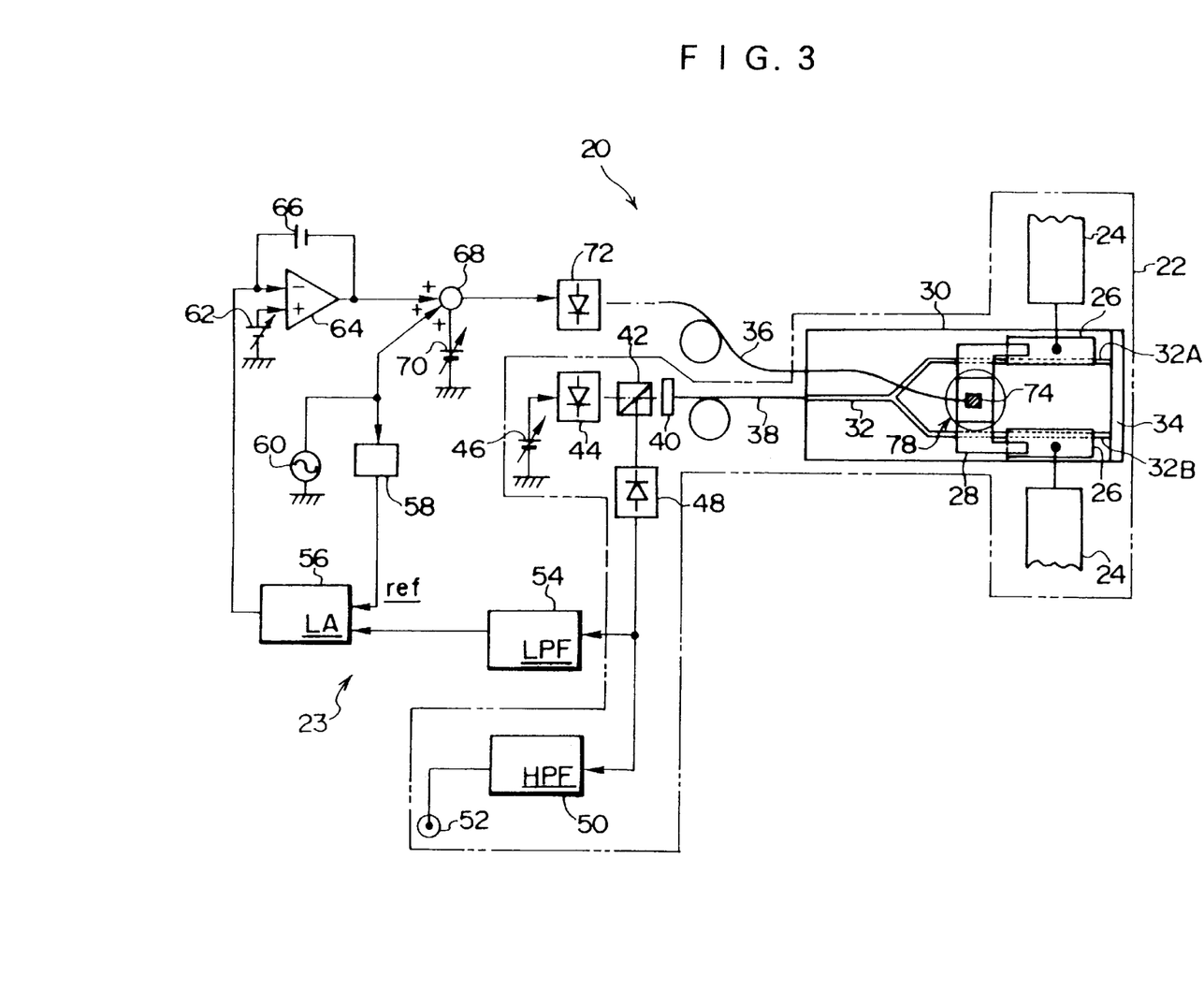
FIG. 3 is a block diagram illustrating a schematic structure of an electric field detecting device relating to the present embodiment.

As illustrated in FIG. 3, an electric field detecting device 20 of the present embodiment is formed by an electric field sensor section 22, which is a main section which detects an electric field, and a stabilizing section 23, which stabilizes an optical modulator 30 included in the electric field sensor section 22.

The electric field sensor section 22 is equipped with a light source 44 for measurement which oscillates when DC bias is applied thereto by a bias device 46. In the present embodiment, a semiconductor laser which has a wavelength band of 1.3 µm is used in CW oscillation as the light source 44 for measurement. However, the light source 44 for measurement is not limited to a semiconductor laser having a wavelength band of 1.3 µm. For example, a semiconductor laser having a wavelength band of 0.8 µm, an HeNe laser (gas laser) or other types of light sources may be used as the light source 44 for measurement.

A polarizing beam splitter (hereinafter, "PBS") 42, a Faraday rotator (hereinafter, "FR") 40, and a polarization-maintaining fiber (hereinafter "PMF") 38 are disposed in that order at the light output side of the light source 44 for measurement. The PMF 38 is provided such that one end thereof contacts the FR 40 and the other end thereof contacts the optical modulator 30.

A Y-branch waveguide 32, straight-line waveguides 32A, 32B, and a reflecting portion 34 are provided at the optical modulator 30. One end of the Y-branch waveguide 32 is provided such that light from the PMF 38 is guided, and the other ends of the Y-branch waveguide 32 are connected to respective ones of ends of the straight-line waveguides 32A, 32B such that the light guided by the Y-branch waveguide 32 (incident light) is branched thereat and divided in two to a 50:50 ratio and propagated along the straight-line waveguides 32A, 32B. The reflecting portion 34 is provided at the respective other ends of the straight-line waveguides 32A, 32B. Electrodes 26 to which dipole antennas 24 are connected are provided on the straight-line waveguides 32A, 32B.

In the present embodiment, a case is described in which an optical modulator having a Y-branch waveguide is used. However, the present invention is also applicable to other optical modulators. For example, the present invention is also applicable to a modulator which has at least one mode coupling-type (or directional coupler-type) branch portion and which does not have a Y-branch portion, i.e., a modulator in which at least one region corresponding to the above-described Y-branch portion is set at a directional coupler.

An optical detector 48, which outputs an electric signal (voltage or current) corresponding to the light intensity, is provided at the reflecting side of the PBS 42. In the present embodiment, a photodiode is used as the optical detector 48. However, the optical detector 48 is not limited to a photodiode, and another optical detector which outputs an electric signal corresponding to light intensity, such as a photomultiplier tube or the like, may be used.

The optical detector 48 is connected, via a high pass filter circuit (hereinafter, "HPF") 50, to a terminal 52 for obtaining an electric field intensity measurement signal.

Operation of the electric field sensor section 22 structured as described above will now be described. First, light from the light source 44 for measurement is transmitted through the PBS 42. The polarization plane is rotated π/4 at the FR 40, and the light is transmitted to the optical modulator 30 with polarization plane maintained by the PMF 38. The light transmitted to the optical modulator 30 is propagated via the Y-branch waveguide 32 and the straight-line waveguides 32A, 32B, and is reflected at the reflecting portion 34. The light reflected by the reflecting portion 34 (hereinafter called the "return light") is propagated in the direction opposite to that described above, and is transmitted through the PMF 38 and the FR 40. The polarization plane of the return light is rotated $\pi/4$ at the FR 40, so as to have been rotated a total of $\pi/2$. The return light is reflected at the PBS 42, an electric signal corresponding to the light intensity is outputted at the optical detector 48, and a measurement signal is supplied to the terminal 52 via the HPF 50. When the light propagates along the straight-line waveguides 32A, 32B, voltage is applied to the electrodes 26 in accordance with the intensity of the electric field at the periphery at which the dipole antennas 24 are disposed, and the propagated light is intensity-modulated. Accordingly, the return light is intensity-modulated, and reaches the optical detector 48. By converting voltage and outputting at the optical detector 48, the electric field intensity is measured without the electric field to be measured being disturbed.

However, when the phase bias of the waveguide-type optical modulator of the sensor section fluctuates due to effects such as temperature or the like, the precision deteriorates due to fluctuations in sensitivity, the generation of harmonics, or the like. Therefore, in the present embodiment, the stabilizing section 23 is provided. By stabilizing the optical modulator 30 which includes the electric field sensor section 22, deterioration in precision due to fluctuations in sensitivity, the generation of harmonic distortion or the like is suppressed.

The structure of the stabilizing section 23 for stabilizing the optical modulator 30 including the electric field sensor section 22 will now be described. The stabilizing section 23 includes a low pass filter circuit (hereinafter, "LPF") 54 and a synchronization detector (hereinafter, "LA") 56. The LPF 54 and the LA 56 are connected such that the output signal of the optical detector 48 is inputted to the comparison side of the LA 56 via the LPF 54. An oscillator 60, which oscillates at a predetermined frequency (10 Hz in the present embodiment), is connected to the reference side of the LA 56 via a multiplier 58. The output side of the LA 56 is connected to one input side of an integrator-type error amplifier 64 having a voltage source 66. The other input side of the error amplifier 64 is grounded via a variable voltage source 62 for setting reference voltage. The output side of the error amplifier 64 is connected to the first input side of an adder 68. The second input side of the adder 68 is connected to the oscillator 60. The third input side of the adder 68 is grounded via a variable voltage source 70 for setting reference voltage. The output side of the adder 68 is connected to a light source 72 for control. Control voltage (direct current) and a low-frequency alternating current voltage signal of several tens of Hz or less are outputted from the adder 68.

The light source 72 for control outputs laser light at a light intensity corresponding to the input signal from the adder 68. A multi-mode light fiber (hereinafter, "MMF") 36 is provided at the light output side of the light source 72 for control. The MMF 36 guides the light of the light source 72 for control to a photoelectric converting section 78 which will be described later.

In the present embodiment, a semiconductor laser of a wavelength band of 0.8 $\mu$m is used as the light source 72 for control. However, the light source 72 for control is not limited to a semiconductor laser of a wavelength band of 0.8 $\mu$m. Another light source may be used provided that it is a light source whose intensity can be modulated by an electric signal and provided that it conforms to the sensitivity wavelength band of an anomalous photovoltaic film 74 which will be described later.

Because the MMF 36 only transmits light (the light intensity or the light amount), a glass fiber, a plastic fiber, single mode fibers thereof or the like may be used for the MMF 36.

Figure 4A:
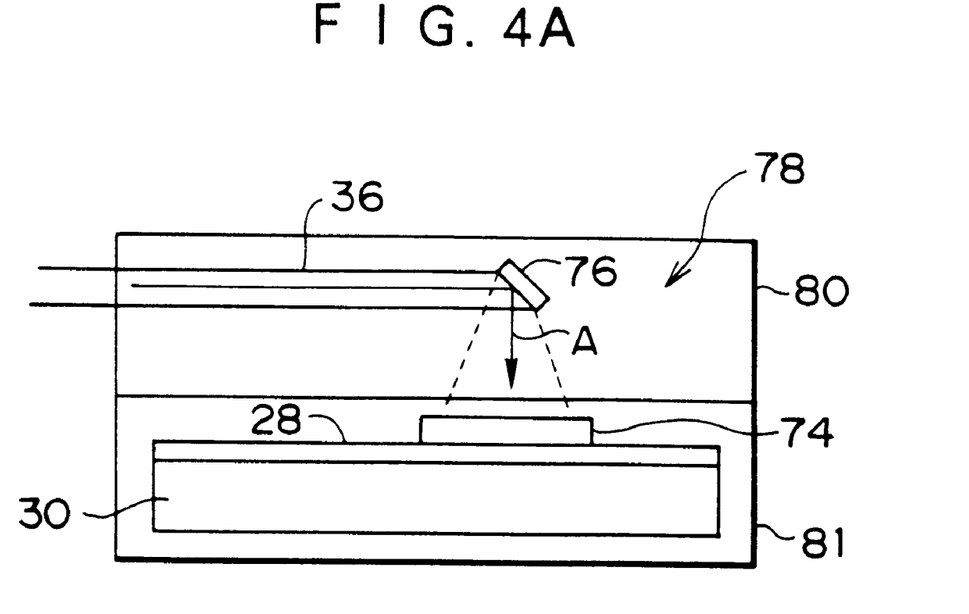
FIGS. 4A and 4B are partial extracted views illustrating a peripheral structure of an anomalous photovoltaic film.
Figure 4B:
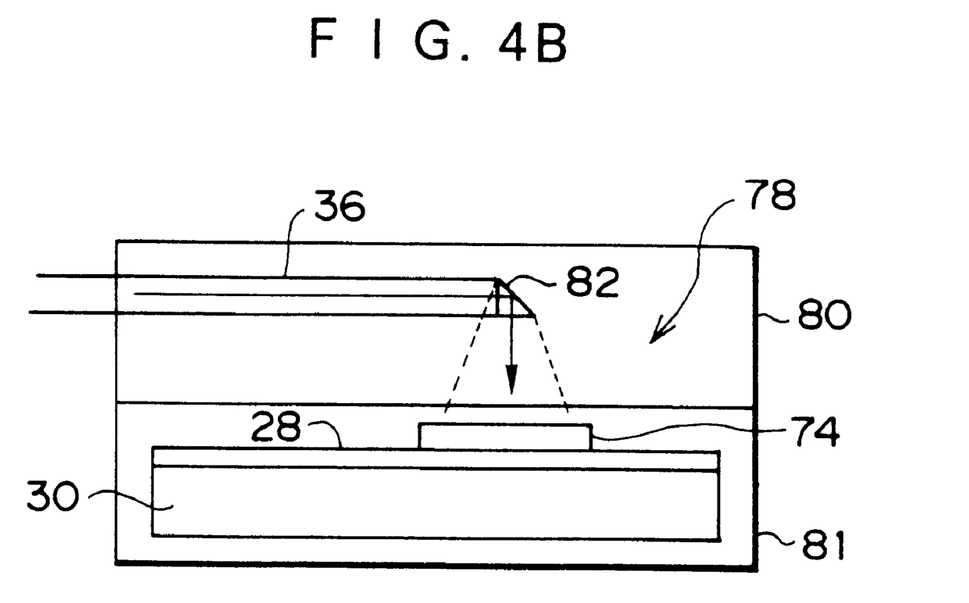

The photoelectric converting section 78 is provided on the optical modulator 30. The photoelectric converting section 78 includes an electrode 28 for stabilization which is provided so as to contact the electrodes 26 of the optical modulator 30. The ultra-high impedance anomalous photovoltaic film 74 (see FIG. 4) is provided on the electrode 28 for stabilization. The anomalous photovoltaic film 74 will be described in more detail later. For example, the anomalous photovoltaic film 74 may be an oblique-deposited film formed by using CdTe or CdS/CdTe.

The above description is of a case in which the electrode 28 for stabilization is provided in contact with the electrodes 26 of the optical modulator 30. However, it is possible not to provide the electrode 28 and to layer the anomalous photovoltaic film 74 itself on the electrodes 26 of the optical modulator 30.

As illustrated in FIG. 4A, the distal end of the MMF 36 is disposed at a position which is directly above the anomalous photovoltaic film 74 and which is separated from the film surface by approximately 1 mm. The upper surface of the distal end portion of the MMF 36 is cut to an angle of 45 degrees, and a gold film is formed on the cut surface by an electron beam deposition method so as to form a reflecting film 76. By using an epoxy resin adhesive, the MMF 36 is fixed to a cover 80 of a package which is formed from an organic polymer. The optical reflector 30 is housed in a package main body 81 formed from an organic polymer. The main body 81 and the cover 80 are adhered together by an ultraviolet cured resin so as to be sealed. The light propagated along the MMF 36 is reflected by the reflecting film 76 in a predetermined direction designated by the arrow A. The reflected light is illuminated onto the anomalous photovoltaic film 74. To illuminate the control light onto the anomalous photovoltaic film 74, the reflecting film 76 illustrated in FIG. 4A may be used. Or, instead of the reflecting film 76, as illustrated in FIG. 4B, a prism 82 fixed to the distal end portion of the MMF 36 by an ultraviolet cured resin may be used.

In this way, the stabilizing section 23 is formed by a structure, which illuminates to the photoelectric converting section 78 the light of the light source 72 for control via the MMF 36 from a distance to the anomalous photovoltaic film 74, and by a feedback circuit, which extracts the voltage caused by phase bias fluctuation from the optical detector 48 of the electric field sensor section 22 and feeds the voltage back to the light source 72 for control.

Next, operation of the present embodiment will be described.

The light source 72 for control, which emits control light, is driven by the control voltage (direct current) and the low-frequency alternating current voltage of several tens of Hz or less, which are outputted from the adder 68. The control light emitted from the light source 72 for control is illuminated onto the anomalous photovoltaic film 74 via the MMF 36. Due to this illumination of the control light, voltage corresponding to the intensity of the control light is generated at the anomalous photovoltaic film 74. The generated voltage is applied to the electrodes 26 via the electrode 28 for stabilizing as modulating voltage for the optical modulator 30.

Due to the modulating voltage applied to the electrode 28, the phase bias of the optical modulator 30 slowly oscillates.

In this way, the light propagated along the optical waveguides is intensity-modulated. More specifically, the light intensity of the return light from the optical modulator 30 reflected at the reflecting portion 34 from the optical modulator 30 changes, and the change in the light intensity is converted into voltage at the optical detector 48. The converted signal voltage is extracted by the LPF 54 and is outputted to the LA 56. The signal passing through the HPF 50 is outputted to the terminal 52 as the original electric field measurement signal.

The signal extracted at the LPF 54 is synchronously detected by the LA 56 with the low-frequency signal added to the light source for control (the signal of 10 Hz in the present embodiment) being used as a reference, and is outputted to the error amplifier 64 as a voltage proportional to the change in light intensity, i.e., the fluctuation in phase bias. At the error amplifier 64, the input signal is negatively fed back to the driving voltage of the light source for control, which is the output signal of the error amplifier 64. In this way, by negative feedback of a voltage proportional to the phase bias fluctuation to the drive voltage of the light source for control, at the light source 72 for control, light of an intensity proportional to the phase bias fluctuation is output, and this light is illuminated to the anomalous photovoltaic film 74. Due to this illumination, a voltage which suppresses the phase bias fluctuation is generated, and the phase bias fluctuation at the optical modulator 30 is suppressed.

In this way, when the phase bias of the optical modulator 30 fluctuates, a bias fluctuation signal corresponding to the phase bias fluctuation is included in the output signal which converts the light from the optical modulator 30 into an electric signal at the optical detector 48. This phase bias fluctuation signal is extracted at the LPF 54, and at the error amplifier 64, is compared with a reference value and a difference is determined. In this way, the magnitude of the bias fluctuation is detected. The light source 72 for control is driven by a signal which includes the output signal from the adder 68 which has a negative feedback structure such that the sign of the polarity of the change in the phase bias fluctuation is in a reversed-relationship with the sign of the polarity of the voltage corresponding to the difference from the reference voltage. Therefore, the control light is illuminated onto the anomalous photovoltaic film, and a photovoltaic voltage which offsets the bias fluctuation is generated. Accordingly, even if phase bias fluctuations are generated, they are offset by the generation of the photovoltaic voltage which results from the illumination of the control light, and the characteristics of the optical modulator are stabilized.

In accordance with the electric field detecting device 20 of the present embodiment, the phase bias of the optical modulator 30 can be controlled without using an electrical wire. Fluctuations in sensitivity (gain) can be stabilized, and precision and practicality can be improved.

In order to correct the phase bias fluctuation of the optical modulator, the light resulting from the driving signal which is negatively fedback in accordance with the phase bias fluctuation is directly illuminated to the optical modulator. Therefore, no harmful interference voltage which lowers the S/N ratio of the optical modulator is induced. Accordingly, if the present optical modulator is used in an electric field sensor, highly precise measurement is made possible with a simple structure. Further, because the anomalous photovoltaic film has ultra-high impedance, the frequency characteristic of the electric field sensor does not deteriorate. In this way, because fluctuations in the sensor characteristics are suppressed, precision and practicality are greatly improved.

Further, because the anomalous photovoltaic film 74 has ultra-high impedance, the frequency characteristic of the optical modulator 30 which functions as an electric field sensor does not deteriorate. Moreover, only the anomalous photovoltaic film 74 and the MMF 36 are added to the optical modulator. No metal parts or metal signal wires are added. Therefore, the feature that the electric field to be measured is not disturbed is maintained.

Figure 5:
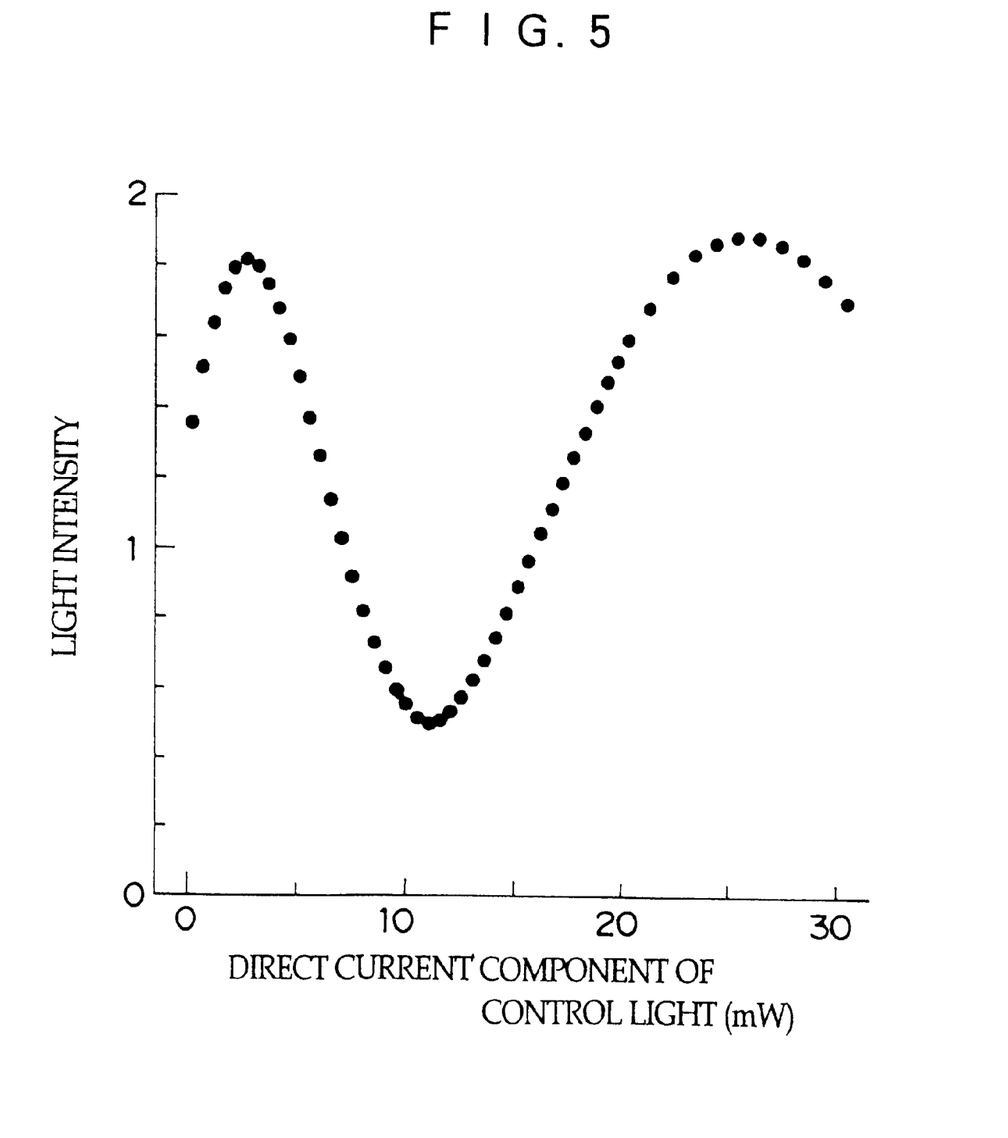
FIG. 5 is a graph illustrating the results of an experiment conducted in order to evaluate the effectiveness of optical modulator stabilization, and illustrates a control characteristic (the relationship between intensity of control light and intensity of output light of the optical modulator) of a light control-type optical modulator in which the anomalous photovoltaic film is integrated.

FIG. 5 illustrates, as the results of an experiment for evaluating the effectiveness of the stabilization of the optical modulator used for electric field detection of the present embodiment, the control characteristic of a light control-type optical modulator in which the anomalous photovoltaic film has been integrated, i.e., the relationship between the intensity of the control light and the intensity of the output light of the optical detector is illustrated in FIG. 5. FIG. 5 illustrates that, in accordance with an increase in the intensity of the control light, the photovoltaic voltage of the anomalous photovoltaic film 74 increases, and accordingly, the intensity of the output light of the optical modulator varies as a sine function. As can be understood from FIG. 5, in a vicinity of a control light intensity of 7 mW, the phase bias is $\pi/2$, and the slope of the characteristic curve is greatest. If this region is used as the operating point, the sensitivity of the electric field sensor with respect to voltage is greatest.

Figure 6A:
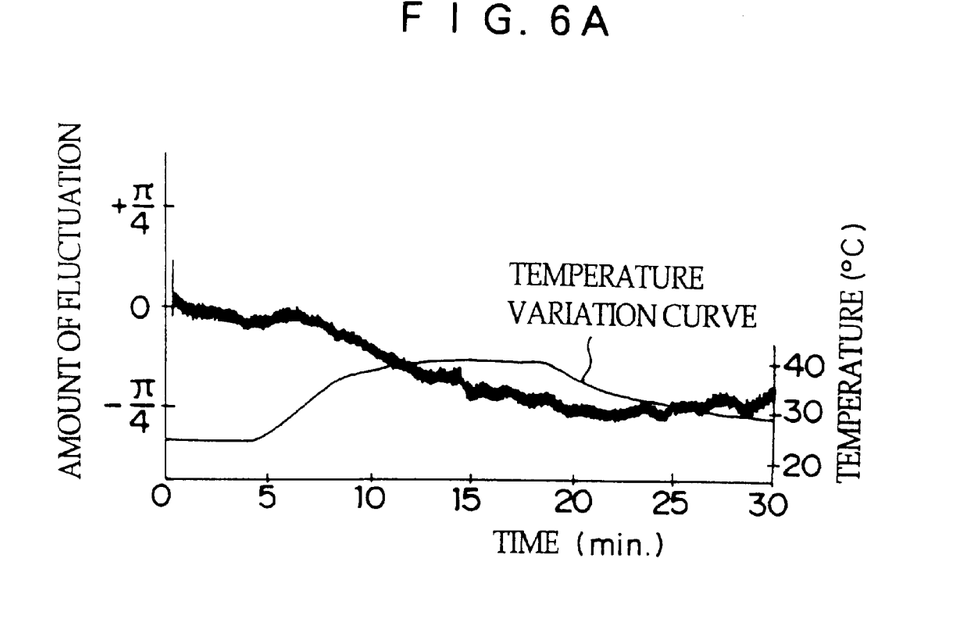
FIGS. 6A and 6B are graphs illustrating the results of an experiment conducted in order to evaluate the effectiveness of optical modulator stabilization, and illustrates fluctuations in the operating point of the optical modulator.
Figure 6B:
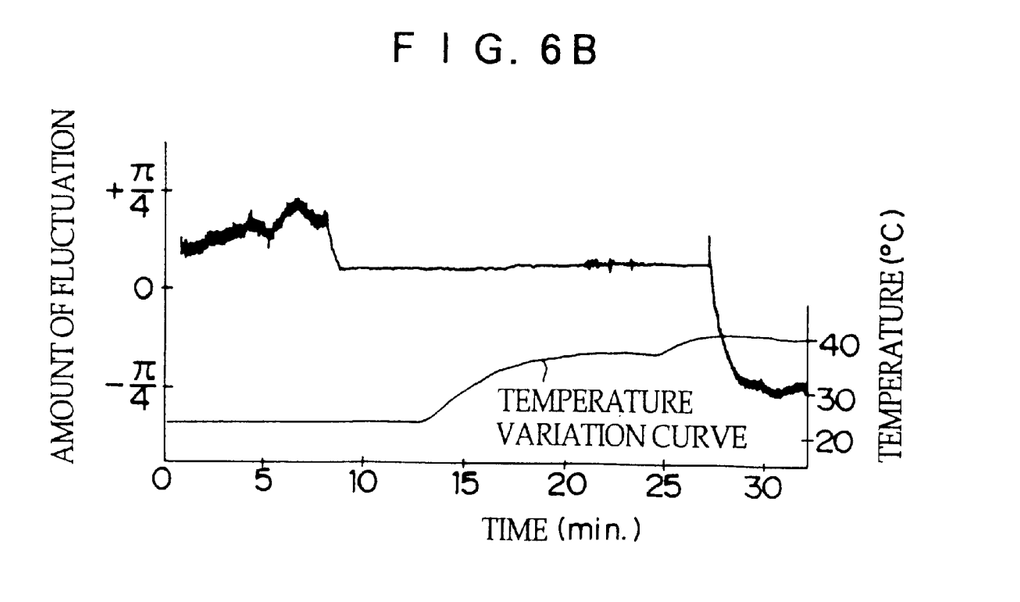

FIGS. 6A and 6B illustrate an example of fluctuations in the operating point of an optical modulator, as results of an experiment conducted in order to evaluate the effectiveness of the stabilization of the optical modulator used for electric field detection of the present embodiment. In FIGS. 6A and 6B, the fluctuation amount of the operating point of the optical modulator is converted into and illustrated as the phase. FIG. 6A illustrates fluctuations in the operating point of the optical modulator in a case in which light control stabilizing feedback is not carried out. FIG. 6B illustrates fluctuations in the operating point of the optical modulator in a case in which light control stabilizing feedback is carried out.

As can be understood from FIG. 6A, when stabilization is not carried out, due to a change in the ambient temperature from room temperature to 40° C., the operating point fluctuates by about $\pi/4$ as converted into phase bias. On the other hand, as can be seen in FIG. 6B, in a case in which the stabilization feedback of the present embodiment is carried out, the fluctuation in the operating point is controlled to an amount which can almost be ignored, and the fluctuation in sensitivity is near zero.

Next, the method of forming the anomalous photovoltaic film 74 will be described.

Figure 7:
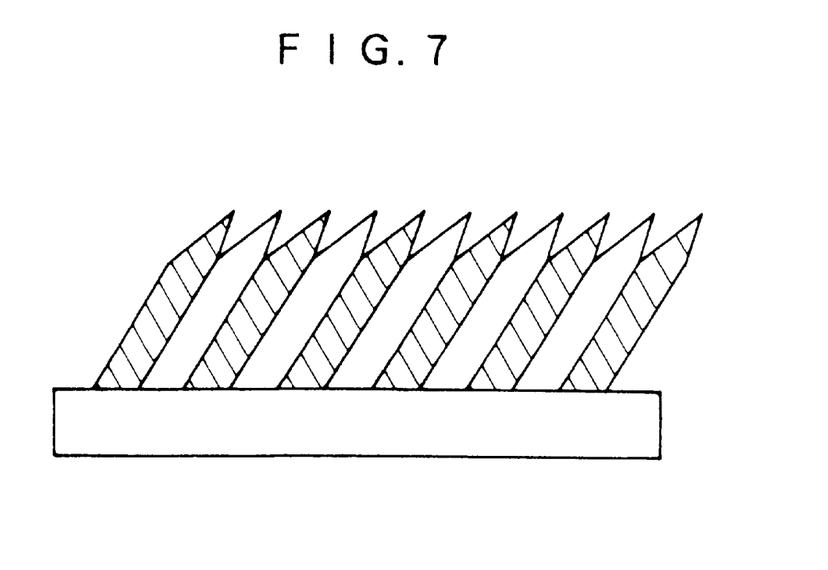
FIG. 7 is a graph illustrating one example of the structure of the anomalous photovoltaic film.
Figure 8:
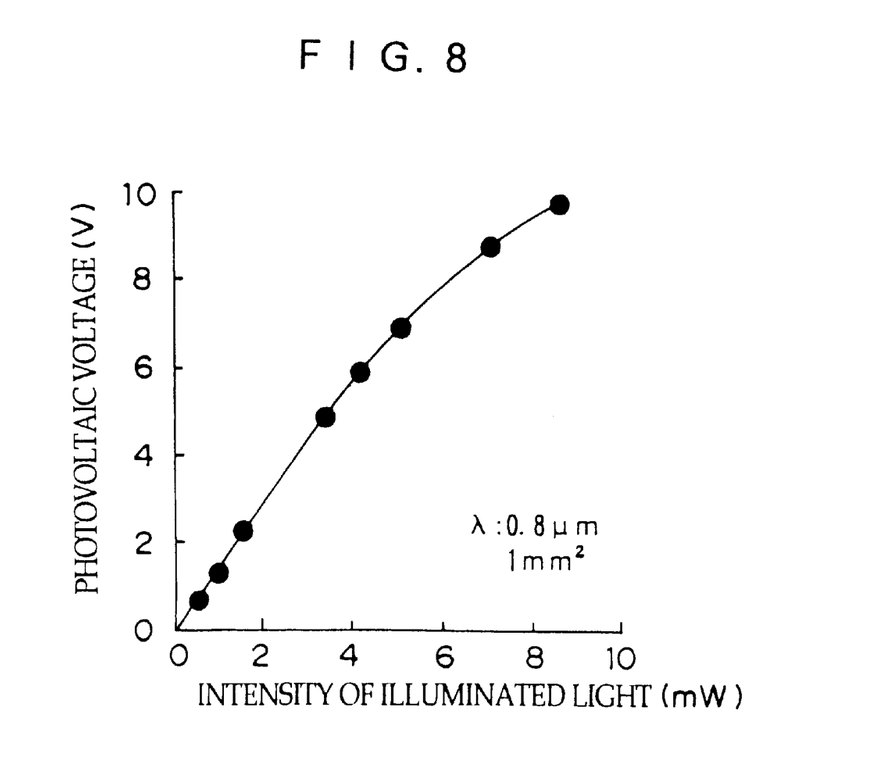
FIG. 8 is a graph illustrating a characteristic showing the relationship between photovoltaic voltage and the intensity of illuminated light when light is illuminated to the anomalous photovoltaic film.

The anomalous photovoltaic film 74 is formed from a $CdS_xTe_{1-x}$ film which generates a high voltage even if the amount of illuminated light is extremely small (e.g., 0.1 W/cm$^2$). The anomalous photovoltaic film 74 is formed by a two-source oblique simultaneous deposition method by which the different substances of CdS and CdTe are deposited. More specifically, the two types of targets, CdS and CdTe, are inclined from 30 degrees to 80 degrees with respect to the substrate normal line, are placed symmetrically with respect to the normal line, and are oblique-spatter-deposited simultaneously. In this way, an oblique-deposited film having a cross-section such as that illustrated schematically in FIG. 7 is formed as the anomalous photovoltaic film. FIG. 8 illustrates the relationship between the photovoltaic voltage and the intensity of the illuminated light at the time when light of a wavelength of 0.8 $\mu$m is illuminated onto the anomalous photovoltaic film over a 1 mm² range. The component ratio of the anomalous photovoltaic film is controlled by the electric power projected to the targets at both sides. The component ratio x of the $CdS_xTe_{1-x}$ film is adjusted so as to control the photovoltaic voltage to be generated and the response time. A component ratio x of 0.2 to 0.3 is used for integrating the anomalous photovoltaic film into the optical modulator 30. In a composition range when the anomalous photovoltaic film is integrated into the optical modulator 30, the generated photovoltaic voltage is about 5 V (an amount of illuminated light of 0.1 W/cm²), the response time is 0.1 second, and the generated photovoltaic voltage is the same level as the operating voltage of the optical modulator. Therefore, a component ratio x of 0.2 to 0.3 is applicable to characteristic stabilization. Further, in order to keep the effects of a Ti:LiNbO₃ substrate to a minimum, it is preferable to form the anomalous photovoltaic film at room temperature.

In the above-described example, the anomalous photovoltaic film is formed by two-source oblique deposition. However, the anomalous photovoltaic film may be formed by mixed crystal $CdS_xTe_{1-x}$ deposition. Further, the film structure may be a three-source mixed crystal structure, or a mixture of CdS and CdTe.

In the above-described example, the anomalous photovoltaic film is formed by a $CdS_xTe_{1-x}$ film. However, a semiconductor which has high photovoltaic effect, e.g., CdTe, GaAs, Si, Ge, PbS, ZnS, ZnSe, InP, HgTe, $Sb_2S_3$ and ZnTe, or conductive materials, e.g., CdS, $In_2Te_3$, $SnO_2$, $In_2Te_3+SnO_2$ (ITO) and mixtures with metals (e.g., Au, Ag), or materials formed from structural elements thereof may be used. Even if the above substances are used in combination, the anomalous photovoltaic film can be formed by the two-source oblique deposition method.

As compared with a method in which light is controlled by light using a third-degree non-linear optical material, light can be controlled (light can be modulated) by an extremely small amount of light by using the anomalous photovoltaic film as in the present embodiment. In a case in which light is controlled by light using a third-degree non-linear optical material, a light amount of 1 MW/cm² is needed, whereas in a case in which the anomalous photovoltaic film in accordance with the present embodiment is used, a light amount of 0.1 W/cm² suffices. In accordance with the present embodiment, control can be effected by a light amount which is smaller in the order of $10^{-7}$. Accordingly, modulation can be effected by using an extremely small amount of light, and stabilization of the characteristics of an optical modulator which does not use a metal signal wire can be achieved easily.

In the present embodiment, a case is described in which the present invention is applied to an electric field sensor. However, the present invention can be structured in substantially the same way when applied to other sensors such as a voltage sensor, a magnetic field sensor, or the like. For example, the present invention may be applied to a voltage sensor merely by replacing the dipole antennas connected to the electrodes of the optical modulator illustrated in FIG. 3 with lead wires or contact probes which are connected to the voltage measuring point. Further, in a case in which the present invention is used as a magnetic field sensor, loop antennas may be used in place of the dipole antennas, and there is no need to change the stabilizing section 23 for stabilization.

As described above, in accordance with the first aspect of the present invention, in order to correct the phase bias fluctuation of the optical modulating means, light resulting from a driving signal which is negatively fedback in accordance with the phase bias fluctuation is illuminated directly onto the optical modulating means, without using an electrical wire. Therefore, no harmful impedance voltage which lowers the S/N ratio of the optical modulating means is induced.

In accordance with the second aspect of the invention, a low-frequency signal is, by a low-frequency oscillator, superposed on a direct current signal which is obtained by negative feedback of a bias fluctuation signal. Therefore, the phase bias of the optical modulator oscillates slowly. The oscillation is removed by the extracting means, and only the bias fluctuation signal is extracted. Illumination of control light corresponding to the phase bias which has fluctuated is carried out easily.

In accordance with the third aspect of the invention, an ultra-high impedance anomalous photovoltaic film is used as the anomalous photovoltaic film which is the photoelectric converting means. Therefore, the frequency characteristic at the time of measurement of an electric field sensor or the like does not deteriorate.

What is claimed is:

1. A device for stabilizing a modulation operation of an optical modulator, the optical modulator having an optical waveguide provided on a substrate and an electrode provided so as to correspond to said optical waveguide, said device comprising:

optical detecting means for outputting a signal corresponding to the intensity of light outputted from said optical modulator;

control signal outputting means for, on the basis of the output signal of said optical detecting means, outputting a control signal which compensates for a phase bias fluctuation of said optical modulator;

light source means for outputting control light corresponding to said control signal; and voltage applying means, provided in contact with said electrode of said optical modulator, for applying voltage corresponding to said control light to said electrode.

2. A device according to claim 1, wherein said control signal outputting means includes an oscillator for outputting a predetermined constant frequency signal which is used to modulate said optical modulator, and extracting means for, on the basis of the output signal of said oscillator, extracting a signal component of said predetermined constant frequency from the output signal of said optical detecting means and outputting a signal corresponding to the intensity of the extracted signal, said control signal outputting means superimposing the signal, which corresponds to the output signal of said extracting means and compensates for a phase bias fluctuation of said optical modulator, upon said predetermined constant frequency signal to output the superimposed signal as the control signal.

3. A device according to claim 1, wherein said voltage applying means is formed by a photoelectric converting means which is formed by an anomalous photovoltaic film which contacts and is integrated with the electrode.

4. A device according to claim 1, wherein said light source means includes: a light source portion which emits said control light; and an illuminating portion which illuminates onto said voltage applying means the control light from said light source portion.

5. A device according to claim 4, wherein said illuminating portion is formed by one of a reflecting means, an optical guide means, or a combination thereof.

6. A device according to claim 3, wherein said anomalous photovoltaic film is formed by two-source oblique simultaneous deposition with two deposit sources of an electrically-conductive substance and a semiconductor having a photovoltaic effect.

7. A method for stabilizing a modulation operation of an optical modulator, the optical modulator having an optical waveguide provided on a substrate and an electrode provided so as to correspond to said optical waveguide, said method comprising the steps:

outputting a signal corresponding to the intensity of light outputted from said optical modulator;

outputting a control signal which compensates for a phase bias fluctuation of said optical modulator on the basis of said output signal corresponding to intensity of light;

outputting control light corresponding to said control signal; and applying voltage corresponding to said control light to said electrode.

8. A method according to claim 7, wherein said control signal outputting step includes the steps of:

modulating said optical modulator with a predetermined constant frequency signal;

extracting a signal component of said predetermined constant frequency from the output signal of said light intensity signal outputting step on the basis of said predetermined constant frequency signal to output a signal corresponding to intensity of the extracted signal; and superimposing the signal, which corresponds to the output signal of said extracting step and compensates for a phase bias fluctuation of said optical modulator, upon said predetermined constant frequency signal to output the superimposed signal as the control signal.

9. A method according to claim 7, wherein said voltage applying step includes generating a voltage corresponding to said control light using a photoelectric converting means which is formed by an anomalous photovoltaic film which contacts and is integrated with the electrode.

* * * * *